Sept. 30, 1969 G. OESTERHELT ET AL 3,470,033
THERMOELECTRIC DEVICE COMPRISING SILICON ALLOY THERMOCOUPLE LEGS BONDED BY A SOLDER COMPOSED OF PALLADIUM ALLOY
Filed March 29, 1968
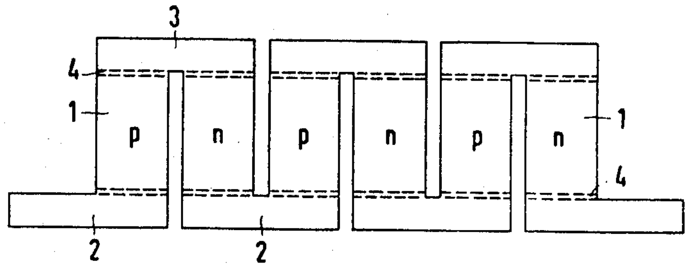

United States Patent Office 3,470,033

Patented Sept. 30, 1969

3,470,033

THERMOELECTRIC DEVICE COMPRISING SILICON ALLOY THERMOCOUPLE LEGS BONDED BY A SOLDER COMPOSED OF PALLADIUM ALLOY

Gerhard Oesterhelt, Nuremberg, Eugen Szabo de Bucs, Erlangen, and Alfred Kunert and Joachim Rupprecht, Nuremberg, Germany, assignors to Siemens Aktiengesellschaft, Berlin, Germany, a corporation of Germany Filed Mar. 29, 1968, Ser. No. 717,229

Claims priority, application Germany, Apr. 1, 1967, S 109,151

Int. Cl. H01v *1/14*

U.S. Cl. 136—237 16 Claims

ABSTRACT OF THE DISCLOSURE

In a thermoelectric device with thermocouple legs of silicon alloy interconnected by contact bridges which are soldered to the legs, the solder material consists of an alloy of palladium and silicon with metal (Me) from the group Fe, Co, Ni, Ti, Hf, V, Nb, Ta, Mo and W, according to the composition $Pd_x(Me_ySi_{1-y})_{1-x}$, wherein $0.25 \leq x \leq 0.60$, and $y \geq 0$.

Our invention relates to thermoelectric devices composed of one or more thermocouples whose legs are interconnected by a contact bridge, each leg being formed of a silicon alloy. The invention further relates to a method of producing such thermoelectric devices.

Thermoelectric devices composed of thermocouple legs which alternately have p-type and n-type conductivity and which are electrically interconnected by contact bridges, must satisfy exacting requirements with respect to the contact formation between the legs and the interconnecting bridges. The contacting bond must be mechanically strong and rugged. The thermal coefficient of expansion of the material in the contact zone must be substantially coincident with that of the leg materials and bridge materials. The contact zone should also possess a lowest feasible thermal and electrical resistance since these are among the criteria upon which the efficiency of a thermogenerator depends.

It is known to fuse the legs of the thermocouples onto the contact bridges by subjecting the junction to an electric high-frequency field. This may cause demixing of the alloy components which constitute the thermoelectrically active semiconductor material of the thermocouple legs. The resulting inhomogeneities of the semiconductor alloy, which correspond to a change in the electric resistivity and in most cases involve a reduction in thermal resistance, are accompanied by a reduction in thermoelectric effectivity of the leg material. The fusing operation may impair the doping of the thermoelectrically active semiconductor material, which likewise leads to a diminution in effectivity accompanied by a reduction in efficiency of the thermoelectric device. Furthermore, the fusing operation may cause a mutual contacting of materials of opposed types of conductivity, for example when an n-type thermocouple leg is fused onto a contact bridge of highly doped p-type silicon. The positive and negative electric charge carriers in the contact zone then compensate each other so that the contact zone becomes substantially undoped and increases the internal resistance, which greatly reduces the effectivity of the device component. Sometimes the same phenomenon may produce a p-n barrier layer and thus interrupt the current path.

In addition, it cannot be expected that the fusing operation will cause a uniform contacting between thermocouple leg and contact bridge over the entire area of the contact zone. The high-frequency field acts from the outside; under unfavorable circumstances, therefore, there may occur uncontacted spots in the interior of the contact zone, and such spots likewise entail a corresponding reduction in efficiency. Such occurrences also have the consequence that the contacting within the entire area of the contact zone is not entirely free of mechanical tension. For that reason, if devices made by this method are subjected to frequent changes in temperature or mechanical stresses, they are apt to be unstable. Hence a maintenance-free performance of thermoelectric devices made in this manner is not reliably secured.

It is further known to solder or braze the thermocouple legs onto the contact bridges. The solders used for this purpose must be adapted to the particular leg material and to the material of the contact bridges (in this specification the term "soldering" is used synonymously with the term "brazing"). For contacting thermocouple legs formed of a germanium-silicon alloy there has been employed a solder which consists of doped germanium and silicon and whose liquidus temperature, on account of the relatively high germanium content, is below the solidus temperature of the thermoelectrically active semiconductor alloy. To a large extent the use of this solder affords the assurance that the doping of the thermocouple leg will not change and that the alloy material of the leg will not become demixed. If a high efficiency is to be attained, however, thermogenerators are subjected to temperatures of about 1000° C. at the hot junction side. At these temperatures the germanium share of the germanium-silicon solder oxidizes. This decisively modifies the mechanical properties of the contact zone. For that reason, thermoelectric devices contacted with the aid of germanium-silicon solders are not reliable in operation and do not secure maintenance-free performance for prolonged periods of time. Furthermore, the germanium-silicon solder is brittle when solid so that, for avoiding time-consuming further processing, the only advantageous way of depositing this solder upon the contact localities of the legs and bridges is to apply it in pulverulent form. As a consequence, however, there is no assurance that the solder layer will have the same thickness over the entire area of the contact zone. Thus the contact zones have a non-defined composition which again leads to impairing the efficiency of the thermogenerator.

Relating to thermoelectric devices, it is an object of our invention to produce by means of a solder a contact zone whose thermal coefficient of expansion can be readily matched substantially to that of the semiconductor material of the thermocouple legs and to that of the material from which the contact bridges are made. A conjoint object of the invention is to also provide for highest feasible electrical and thermal conductivity in the contact zone and to also render the contact zone resistant to oxidation. A further object of the invention, in conjunction with those mentioned, is to prevent the solder from causing demixing the leg material or from substantially modifying its doping, while nevertheless providing a stable, tension-free and mechanically strong bond. Still another object of our invention is to provide a solder bond at the above-described localities within thermoelectric devices, preferably thermogenerators, that can be continuously subjected to high temperatures such as in the neighborhood of 1000° C. and thereby secure a high efficiency of the thermogenerator as compared with conventional devices of this type.

According to our invention, we contact and bond the thermocouple legs with the contact bridges in a thermoelectric device by means of a solder consisting of a palladium-silicon alloy, preferably an alloy of the ternary type, corresponding to the composition $Pd_x(Me_ySi_{1-y})_{1-x}$ with $0.25 \leq x \leq 0.60$ and $y \geq 0$, wherein Me is iron, cobalt, nickel or metal from the fourth, fifth or sixth subgroup of the periodic system of elements with the exception of chromium or zirconium; that is, the component Me is Fe, Co, Ni, Ti, Hf, V, Nb, Ta, Mo or W.

By virtue of the palladium content, the melting point of the solder bond between the leg and the contact bridge is reduced relative to the melting point of the silicon-containing semiconductor alloy of which the leg is made. Also on account of the palladium content of 25 or more atom percent, the solder bond is stable against oxidation and thus is resistant to corrosion, and the solder has good wetting properties. The metallic component Me further contributes to securing a particularly high mechanical strength of the contacting bond. The contact also exhibits good hardness, high resistance to breaking and high stability with respect to changes in temperature. Furthermore, the contacting operation does not cause changes in doping of the semiconductor material constituting the thermocouple legs, because the added alloying metals have no or only a very slight doping effect. The solder further acts, so to say, as a "diffusion brake" which prevents the mutual compensation or combination of electric charge carriers in the contact zones in which opposingly doped regions abut against each other.

We have found that particularly good results are obtained whenever the composition of the solder, within the above given limits, corresponds substantially or at least roughly to the eutectic point $Pd_{0.435}(Me_ySi_{1-y})_{0.565}$ or, within the initially stated limits, is substantially eutectoid, such as the composition: $Pd_{0.55}(Me_ySi_{1-y})_{0.45}$. Numerous alloys found particularly favorable are within the range $Pd_{0.42-0.39}(Me_ySi_{1-y})_{0.58-0.61}$. Many of the compositions identified in the tabulation presented hereinbelow constitute the terminal compositions of the latter range, but the intermediate compositions as well as various compositions beyond the preferred range just stated have also been found advantageous, and several of those are likewise described in the tabulation.

It is of advantage if the material of the contact bridges used for electrically and thermally interconnecting the two legs of each thermocouple in the device is made in the known manner of a silicon alloy whose composition corresponds to the general formaul $Me_zSi_{1-z}$ with $z \geq 0$, wherein Me denotes iron or metal from the fourth, fifth or sixth subgroup with the exception of chromium and zirconium (namely Fe, Co, Ni, Ti, Hf, V, Nb, Ta, Mo, W). With such a composition of the bridges, it is of advantage to give the alloy component $Me_ySi_{1-y}$ of the solder a composition which at least approximately corresponds to the composition of the contact-bridge material. Contact-bridge materials of the just-mentioned type are particularly recommended for use in thermogenerators, i.e. devices which directly convert heat into electricity.

By employing a solder composition thus adapted to the composition of the contact-bridge material, a continuous transition from the contact bridge to the leg in the contact zone is achieved and any residual, already slight differences between the thermal coefficients of expansion of the bridge material and the semiconductor alloy of the legs are compensated over the entire temperature range required. The good qualities of the contact bond mentioned above are thus further augmented and a particularly rugged design as well as optimal efficiency of the thermogenerator are secured.

The following tabulation indicates a variety of solder compositions according to the invention particularly advantageous for thermoelectric devices, especially in combination with the correspoding contact-bridge materials.

| Contact-bridge material | Solder composition |
|---|---|
| $Ti_{0.14}Si_{0.86}$ | $Pd_{0.42}(Ti_{0.14}Si_{0.86})_{0.58}$ |
| | $Pd_{0.39}(Ti_{0.14}Si_{0.86})_{0.61}$ |
| $Hf_{0.075}Si_{0.925}$ | $Pd_{0.42}(Hf_{0.04}Si_{0.96})_{0.58}$ |
| | $Pd_{0.39}(Hf_{0.04}Si_{0.96})_{0.61}$ |
| $V_{0.03}Si_{0.97}$ | $Pd_{0.42}(V_{0.03}Si_{0.97})_{0.58}$ |
| | $Pd_{0.39}(V_{0.03}Si_{0.97})_{0.61}$ |
| $Nb_{0.12}Si_{0.88}$ | $Pd_{0.42}(Nb_{0.12}Si_{0.88})_{0.58}$ |
| | $Pd_{0.39}(Nb_{0.12}Si_{0.88})_{0.61}$ |
| $Ta_{.006}Si_{0.94}$ | $Pd_{0.42}(Ta_{0.05}Si_{0.94})_{0.58}$ |
| | $Pd_{0.39}(Ta_{0.06}Si_{0.94})_{0.61}$ |
| $Mo_{0.056}Si_{0.944}$ | $Pd_{0.42}(Mo_{0.056}Si_{0.944})_{0.58}$ |
| | $Pd_{0.39}(Mo_{0.056}Si_{0.944})_{0.61}$ |
| $W_{0.06}Si_{0.94}$ | $Pd_{0.42}(W_{0.06}Si_{0.94})_{0.58}$ |
| | $Pd_{0.39}(W_{0.06}Si_{0.94})_{0.61}$ |
| $Fe_{0.07}Si_{0.93}$ | $Pd_{0.42}(Fe_{0.07}Si_{0.93})_{0.58}$ |
| | $Pd_{0.39}(Fe_{0.07}Si_{0.93})_{0.61}$ |
| Highly doped silicon | $Pd_{0.42}Si_{0.58}$ |
| | $Pd_{0.39}Si_{0.61}$ |
| Si-alloy | $Pd_{0.42}(Co_{.005}Si_{0.95})_{0.58}$ |
| Do | $Pd_{0.39}(Co_{0.05}Si_{0.95})_{0.61}$ |
| Do | $Pd_{0.42}(Ni_{0.05}Si_{0.95})_{0.08}$ |
| Do | $Pd_{0.39}(Ni_{0.05}Si_{0.95})_{0.08}$ |
| Do | $Pd_{0.5}(W_{0.05}Si_{0.95})_{0.5}$ |
| Do | $Pd_{0.57}(Mo_{0.04}Si_{0.96})_{0.43}$ |
| Do | $Pd_{0.33}(Ti_{0.15}Si_{0.85})_{0.67}$ |
| Do | $Pd_{0.27}(Nb_{0.15}Si_{0.85})_{0.73}$ |

Due to the metallic components of the solder according to the invention, the solder material is not brittle. The solder therefore permits providing a contact zone which possesses the same thickness and a defined composition over the entire contacting area. A preferred method of obtaining such a uniform contact zone is as follows. The solder is deposited upon the thermocouple leg and/or upon the contact bridge to be joined. Then the deposit is ground down to foil thickness. Susbsequently, the solder coating, now having exactly the desired thickness, is contacted with the area on the leg or bridge to be bonded. The assembly is then subjected to the soldering (brazing) temperature. This method results in a thermoelectric device whose properties virtually do not vary from thermocouple to thermocouple.

The invention will be further described with reference to the embodiment illustrated schematically and by way of example on the accompanying drawing.

The illustrated thermoelectric device is composed of several thermocouples whose legs 1 are alternately of p-type and n-type conductivity. The legs are interconnected by contact bridges 2 and 3 in such a manner that all of the legs are connected electrically in series and thermally in parallel. Consequently all hot junctions are located on one side, such as at the top, and all cold junctions are located at the opposite side, such as at the bottom. The legs 1 are contacted to the bridges 2 and 3 by means of a solder which forms intermediate contact zones 4.

The thermocouple legs are made of a germanium-silicon alloy containing 30 atom percent germanium, the remainder being silicon, or they consist of iron silicide ($FeSi_2$), for example.

The p-type legs of the germanium-silicon alloy are doped with boron, gallium or indium. The n-type legs are doped with phosphorus, arsenic or antimony. The bridge material is preferably an alloy of silicon with a metal of the fourth, fifth or sixth subgroup of the periodic system with the exception of chromium or zirconium, these alloying metals being Fe, Co, Ni, Ti, Hf, V, Nb, Ta, Mo, W. The contacting is effected with a solder composition according to the invention, selecting preferably a solder that substantially matches the composition of the contact-bridge material employed. For contacting, the solder is deposited upon the end face of the legs or upon the contact bridges in a larger quantity than ultimately needed. The deposition may be in any desired form, such as by using a powder and fusing it onto the surface, or by applying a melt which is permitted to solidify. The resultant solid layer is then ground down to the desired foil thickness. Thereafter, the thermocouple leg and the contact bridges are contacted with each other and are subjected to the heat required for fusing and soldering them together. This production method secures a uniformly thin solder layer throughout the entire area of the contact zone 4; and the contact zones have the same predetermined composition and thickness at each individual contact of the thermoelectric device. The grinding of the solder material is facilitated by the fact that the metallic components of the solder composition improve its grindability.

The liquids temperature of solder materials according to the invention is in the neighborhood of 1000° C. and can be varied by varying the share of palladium. These high melting points of the solder permit using a thermogenerator at sufficiently high hot-junction temperatures during continuous operation to secure a high operational efficiency.

To those skilled in the art it will be obvious upon a study of this disclosure that our invention is applicable to a variety of thermoelectric devices and hence may be embodied in structures or realized by means of specific methods other than particularly illustrated and described herein, without departing from the essential features of our invention and within the scope of the claims annexed hereto.

We claim:

1. Thermoelectric device comprising thermocouple legs of silicon alloys, a contact bridge interconnecting the two legs of each couple, and solder joining the bridge with the legs and composed of $Pd_x(ME_ySi_{1-y})_{1-x}$, wherein $0.25 \leq x \leq 0.60$, and Me is Fe, Co, Ni, Ti, Hf, V, Nb, Ta, Mo, or W, with $y \geq 0$.

2. In a thermoelectric device according to claim 1, said solder having the composition $$Pd_{0.42-0.39}(Me_ySi_{1-y})_{0.58-0.61}$$

3. In a thermoelectric device according to claim 1, the mixing ratio of the solder components Pd and $(Me_ySi_{1-y})$ being substantially in accordance with the composition $$Pd_{0.435}(Me_ySi_{1-y})_{0.565}$$

4. In a thermoelectric device according to claim 1, the mixing ratio of the solder components Pd and $(Me_ySi_{1-y})$ being substantially in accordance with the composition $$Pd_{0.55}(Me_ySi_{1-y})_{0.45}$$

5. In a thermoelectric device according to claim 1, said contact bridge being formed of the composition $Me_zSi_{1-z}$ with $z \geq 0$, and $Me_ySi_{1-y}$ having a composition at least approximately corresponding to that of said bridge.

6. In a thermoelectric device according to claim 1, said contact bridge being composed substantially of $Ti_{0.14}Si_{0.86}$, and said solder being composed substantially of $$Pd_{0.08-0.39}(Ti_{0.14}Si_{0.86})_{0.58-0.61}$$

7. In a thermoelectric device according to claim 1, said contact bridge being composed substantially of $Hf_{0.075}Si_{0.925}$ and said solder being composed substantially of $$Pd_{0.42-0.39}(Hf_{0.04}Si_{0.96})_{0.58-0.61}$$

8. In a thermoelectric device according to claim 1, said contact bridge being composed substantially of $V_{0.03}Si_{0.97}$ and said solder being composed substantially of $$Pd_{0.42-0.39}(V_{0.03}Si_{0.97})_{0.58-0.61}$$

9. In a thermoelectric device according to claim 1, said contact bridge being composed substantially of $Nb_{0.12}Si_{0.88}$ and said solder being composed substantially of $$Pd_{0.42-0.39}(Nb_{0.12}Si_{0.88})_{0.58-0.61}$$

10. In a thermoelectric device according to claim 1, said contact bridge being composed substantially of $Ta_{0.06}Si_{0.94}$ and said solder being composed substantially of $$Pd_{0.42-0.39}(Ta_{0.06}Si_{0.94})_{0.58-0.61}$$

11. In a thermoelectric device according to claim 1, said contact bridge being composed substantially of $Mo_{0.056}Si_{0.944}$ and said solder being composed substantially of $$Pd_{0.42-0.39}(Mo_{0.056}Si_{0.944})_{0.58-0.61}$$

12. In a thermoelectric device according to claim 1, said contact bridge being composed substantially of $W_{0.06}Si_{0.94}$ and said solder being composed substantially of $$Pd_{0.42-0.39}(W_{0.06}Si_{0.94})_{0.58-0.61}$$

13. In a thermoelectric device according to claim 1, said contact bridge being composed substantially of $Fe_{0.07}Si_{0.93}$ and said solder being composed substantially of $$Pd_{0.42-0.39}(Fe_{0.07}Si_{0.93})_{0.58-0.61}$$

14. In a thermoelectric device according to claim 1, said contact bridge being composed substantially of doped silicon and said solder being composed substantially of $$Pd_{0.42-0.39}Si_{0.58-0.61}$$

15. In a thermoelectric device according to claim 2, said solder being composed substantially of $$Pd_{0.42-0.39}(Co_{0.05}Si_{0.95})_{0.58-0.61}$$

16. In a thermoelectric device according to claim 2, said solder being composed substantially of $$Pd_{0.42-0.39}(Ni_{0.05}Si_{0.95})_{0.58-0.61}$$

References Cited

UNITED STATES PATENTS

| | | | |
|---|---|---|---|
| 2,995,473 | 8/1961 | Levi. | |
| 3,158,471 | 11/1964 | Kadelburg | 75—165 |
| 3,338,753 | 8/1967 | Horsting | 136—239 |
| 3,342,567 | 9/1967 | Dingwall | 136—239 X |

FOREIGN PATENTS

| | | |
|---|---|---|
| 1,389,727 | 1/1965 | France. |

JOHN H. MACK, Primary Examiner

A. BEKELMAN, Assistant Examiner

U.S. Cl. X.R.

136—239, 241